United States Patent [19]

Wagner

[11] 4,291,286

[45] Sep. 22, 1981

[54] HIGH BANDWIDTH TRANSVERSAL FILTER

[75] Inventor: Gary L. Wagner, Menlo Park, Calif.

[73] Assignee: Ford Aerospace & Communications Corporation, Detroit, Mich.

[21] Appl. No.: 104,624

[22] Filed: Dec. 17, 1979

[51] Int. Cl.$^3$ .................... H03H 15/00; H01P 1/201
[52] U.S. Cl. .................... 333/166; 333/138; 333/156; 333/202
[58] Field of Search ............ 333/18 R, 20, 166, 18 T, 333/23, 28, 156, 202, 236, 238, 33, 19, 165, 138–140; 330/286; 364/824–827

[56] References Cited

U.S. PATENT DOCUMENTS

| | | | |
|---|---|---|---|
| 2,263,376 | 11/1941 | Blumlein et al. | 333/166 X |
| 2,759,044 | 8/1956 | Oliver | 333/166 X |
| 2,790,956 | 4/1957 | Ketchledge | 333/166 X |
| 2,915,716 | 12/1959 | Hattersley | 333/204 |
| 3,495,183 | 2/1970 | Doundoulakis et al. | 330/286 X |
| 3,543,009 | 11/1970 | Voelecker, Jr. | 333/166 X |
| 3,611,201 | 10/1971 | Goell | 333/18 |
| 3,688,194 | 8/1972 | Furois | 333/166 X |
| 3,768,046 | 10/1973 | Lorber et al. | 333/166 X |
| 3,953,745 | 4/1976 | Bailey | 307/221 C |
| 3,997,973 | 12/1976 | Buss | 307/221 D X |
| 3,999,152 | 12/1976 | Sato et al. | 307/221 D X |
| 4,035,628 | 7/1977 | Lampe et al. | 307/221 D X |

OTHER PUBLICATIONS

Wheeler, "Transmission-Line Properties of Parallel Strips Separated by a Dielectric Sheet", IEEE Trans. on Microwave Theory and Techniques, vol. MTT-13, No. 2, Mar. 1965; pp. 172-185.

*Primary Examiner*—Marvin L. Nussbaum
*Attorney, Agent, or Firm*—Alan Huang; Edward J. Radlo; Clifford L. Sadler

[57] ABSTRACT

A high bandwidth transversal filter is described having an input impedance matching network, a tapped delay line, a plurality of weighting amplifiers, a distributed summing circuit, and an output impedance matching network. The delay line is implemented with a transmission line. The input impedance of this transversal filter depends on the inductance and capacitance of the transmission line and the capacitance of the inputs of each of the FET's used as weighting amplifiers. The gates of the FET's provide high impedance low loss taps of the delay line. The weighting is accomplished by either varying the drain current of the FET's or by using capacitive voltage dividers to apportion the tapped signals. The resulting weighted signals are applied to a distributed summing circuit which provides both high bandwidth summing and additional delays. This summer is also implemented with a tapped transmission line. The output impedance of this transversal filter depends on the inductance and capacitance of the summing line and the capacitance of the output of each FET. The parameters of the transmission lines constituting the input delay line and the distributed summer can be selected to provide broadband impedance matching for the input and output of the filter. The FET's thus act as high impedance taps, as weighting amplifiers, and as part of the input and output impedance matching networks.

5 Claims, 8 Drawing Figures

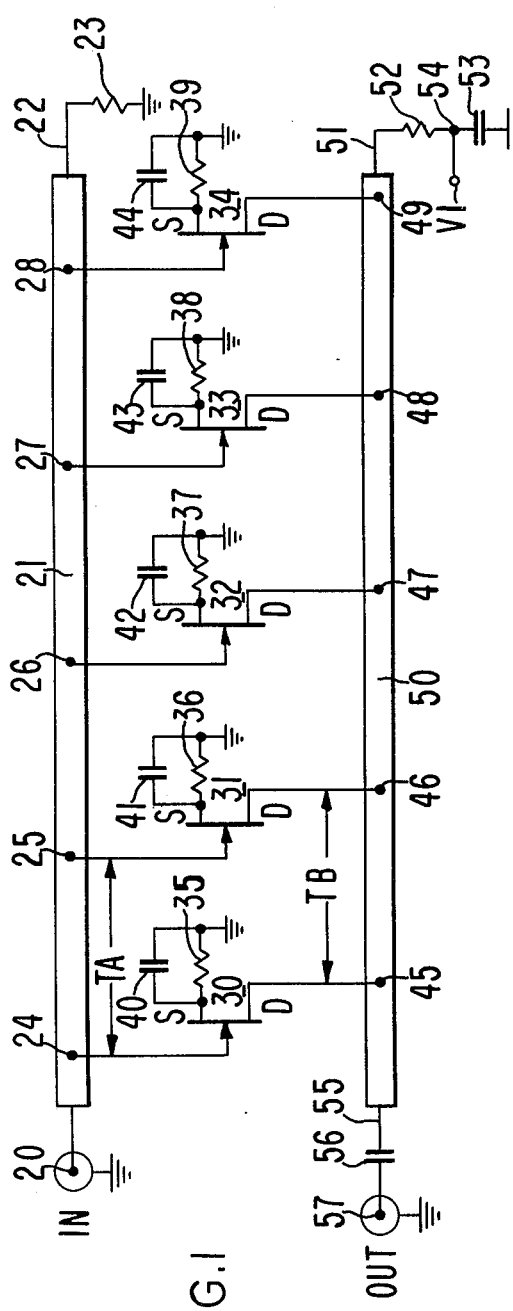
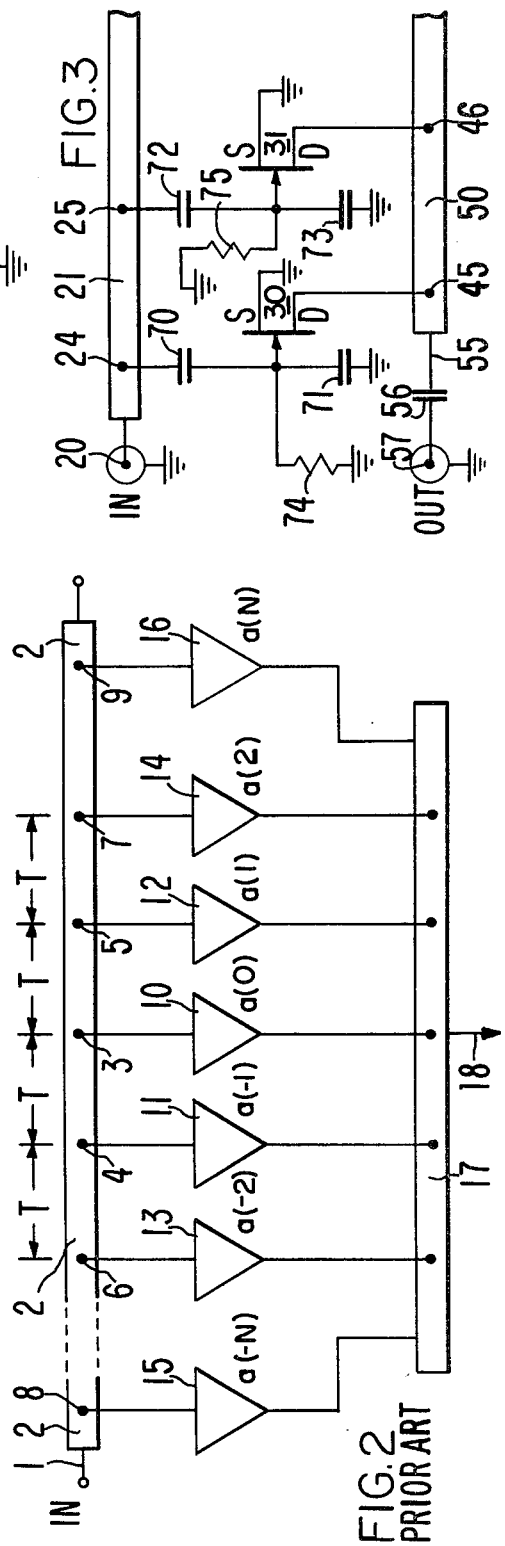
FIG. 1
FIG. 2 PRIOR ART
FIG. 3

LUMPED SUMMING CIRCUIT

DISTRIBUTED SUMMING CIRCUIT

HIGH BANDWIDTH TRANSVERSAL FILTER

BACKGROUND OF THE INVENTION

1. Field of the Invention

This invention is a high frequency high bandwidth transversal filter. One application of this circuit is a high data rate matched filter.

2. Description of the Prior Art

A transversal filter samples a signal at several intervals of time, weights the samples, and sums them to produce an output signal. A block diagram of such a filter is shown in FIG. 2. An input signal is supplied at 1 to a delay line 2. Symmetrically deposed about a central tap 3 of delay line 2 are a plurality of pairs N of secondary taps 4 and 5, 6 and 7, and 8 and 9, separated from the central tap 3 at multiples of a length corresponding to a delay of time T. (FIG. 2 illustrates the special case where N, an arbitrary number, is equal to 3.) These taps are connected to weighting amplifiers 10, 11, 12, 13, 14, 15, and 16, respectively. The weighting factors associated with these amplifiers are denoted as A(0), A(-1), A(1), A(-2), A(2), A(-N), and A(N), respectively. The output signal emerges at 18. The transfer function of such a filter is $$Y(\omega) = a(o) + \sum_{K=1}^{N} (a(-K) + a(K))\cos K\omega T + i \sum_{K=1}^{N} (a(-K) - a(K))\sin K\omega T \quad (1)$$

where $\omega$ is the frequency, $a(K)$ are the weighting factors, and T is the delay between taps.

A prior art search was conducted and the following patents were uncovered:

U.S. pat. No. 3,768,046 is a precision distributed parameter delay line. This patent uses a coaxial or microstrip transmission line for a delay and a stub tuned input to improve the rise time. This circuit is not a filter. The use of a coaxial or microstrip transmission line for a delay is well known. A tuned stub is not used or needed in the present invention.

U.S. Pat. No. 2,915,716 is a microstrip filter. The geometry of the microstrip is modified to provide different lumped inductances and capacitances. This filter is the microwave equivalent of a lumped LC filter. It is a passive filter of a class having an Infinite Impulse Response (IIR). My invention is a transversal filter, using distributed inductances and capacitances of a class having a Finite Impulse Response (FIR).

U.S. Pat. No. 2,759,044 is a circuit for beam aperture correction in horizontal and vertical directions. A transversal filter is used; however, this circuit is not applicable to high frequency operation. The taps on the delay line upset the input impedance of the filter unlike in my invention. This causes phase shifts, attenuation, reflections, and other matching problems at high frequencies, which distort the signal and limit the bandwidth over which this circuit can be used. Furthermore, the junction summing circuit restricts the bandwidth and precludes the additional amount of delay which can be provided by my distributed summing circuit.

U.S. Pat. No. 3,688,194 is a waveform transient measuring circuit and method. The characteristics of the line are changed to compensate for the attached network. The circuit was not intended as a filter nor can it be used as one.

U.S. Pat. No. 3,611,201 is a carrier transversal equalizer. Couplers are used to tap a signal off a transmission line. These signals are then passively attenuated, delayed, and phase shifted. The resulting signals are coupled onto an output line. While these couplers can be constructed so as not to disturb the impedance of the input lines, they are highly lossy, limit the bandwidth, and restrict the filter to intermediate frequency applications. My invention can provide gain and operates from D.C. to frequencies limited only by the transistor characteristics.

U.S. Pat. Nos. 4,035,628 and 3,543,009 were uncovered as secondary references.

SUMMARY OF THE INVENTION

The transversal filter of my invention is constructed with field effect transistors and two transmission lines. One transmission line is used as an input delay line. The other line is used as a distributed summer as well as an output delay line. A plurality of taps are arranged along the input delay line to provide the fixed amounts of delay needed for transversal filter operation. Each tap is connected to the gate of one of a plurality of field effect transistors, which function as high input impedance amplifiers. The high input impedance of the amplifiers is necessary so as not to attenuate the signal as it propagates along the delay line. The weighting factors associated with the various amplifiers are determined either by the drain current of the FET or by a capacitive voltage divider which divides the tapped signal before it is fed to the amplifier. The outputs of the FET amplifiers are fed in a distributed manner to the output transmission line, which provides additional delay and functions as a high bandwidth summer.

The input impedance of the filter depends on the distributed inductance of the transmission line and the distributed capacitance of the line in combination with the input capacitance of the amplifiers. The output impedance of the filter depends on the distributed inductance of the transmission line and the distributed capacitance of the line in combination with the output capacitance of the amplifiers. The characteristic impedance of the transmission lines can be selected to provide a broadband impedance matched input and output for the filter.

This invention thus utilizes the FET's as high impedance taps, as weighted amplifiers, and as part of the input and output impedance matching networks. All four FET roles are desirable ones.

BRIEF DESCRIPTION OF THE DRAWINGS

These and other more detailed and specific objects and features of the present invention are more fully disclosed in the following specification, reference being had to the accompanying drawings, in which:

FIG. 1 is a schematic diagram of one embodiment of the transversal filter of this invention implemented with two tapped transmission lines and a plurality of field effect transistors;

FIG. 2 is a block diagram showing a prior art transversal filter;

FIG. 3 is a schematic diagram of one embodiment of the present invention showing the use of a capacitive voltage divider to weight each tapped signal;

DESCRIPTION OF THE PREFERRED EMBODIMENTS

Figure 4:
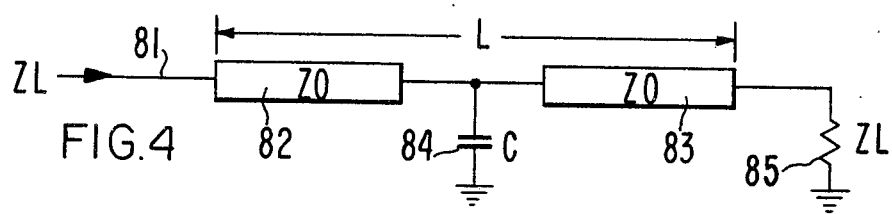
FIG. 4 is a model of a tapped transmission line.

FIG. 1 shows a transversal filter with five taps. The number of taps can be any integral number X, where X is greater than or equal to 2. A signal is applied at 20, the input of a transmission line 21. This line is terminated at 22 to ground through a terminating resistance 23 having the desired input impedance at point 20. Transmission line 21 is used as a delay line. It is tapped at 24, 25, 26, 27, and 28 to provide multiples of TA seconds of delay. These taps are connected to the gates of field effect transistors 30, 31, 32, 33, and 34 respectively. The FET's are used as amplifiers. The sources of each of these transistors are connected to ground via resistors 35, 36, 37, 38 and 39, respectively. These resistors are shunted with bypass capacitors 40, 41, 42, 43, and 44, respectively.

Transistors 30, 31, 32, 33, and 34 are used as amplifiers. The gain of amplifier 30 is a function of its drain current, which depends on the value of resistor 35. This resistor thus determines the gain (i.e., the weighting factor) of the signal associated with tap 24. Resistors 36, 37, 38, and 39 control the weighting factors of the amplifiers comprising transistors 31, 32, 33, and 34, respectively, in a similar manner.

The drains of transistors 30, 31, 32, 33, and 34 are connected to taps 45, 46, 47, 48, and 49, respectively, of transmission line 50. The taps are spaced at intervals corresponding to TB seconds of delay. Transmission line 51 provides additional amounts of delay as well as a high bandwidth summing circuit. It is terminated at point 51 through terminating resistor 52, having the same impedance as the desired output impedance at point 57, and through D.C. blocking capacitor 53 to ground. A voltage source V1 is connected to a point 54 between resistor 52 and capacitor 53 to charge transmission line 50 to provide a voltage source for the FET's.

The sum of the signals from the weighted amplifiers emerges from transmission line 50 at point 55. A coupling capacitor 56 is connected between point 55 and output terminal 57.

A portion of the signal applied at 20 is tapped off at 24 and amplified in a weighted manner by transistor 30. The result is applied to transmission line 50 via tap 45 and emerges at 57 via capacitor 56. The original signal continues to propagate down transmission line 21 from tap 24 towards tap 25. The signal is delayed TA seconds as it travels between taps 24 and 25. A portion of the signal is tapped at 25 and amplified in a weighted manner by transistor 31. The result is applied to transmission line 50 via tap 46. This signal is delayed TB seconds as it travels from tap 46 to tap 45. It then emerges at terminal 57 via capacitor 56. The portion of the signal amplified by transistor 31 emerges at 57 delayed TA+TB seconds relative to the signal amplified by transistor 30.

The portion of the original signal tapped at 26, amplified by transistor 32, and applied at tap 47 to transmission line 50 emerges at 57 delayed 2(TA+TB) seconds relative to the portion amplified by transistor 30. Similarly, the portions amplified by transistors 33 and 34 are delayed 3(TA+TB) and 4(TA+TB) seconds, respectively. If we let T equal TA+TB and view the amounts of delay relative to that of the center-tapped signal (amplified by transistor 32), then the signals amplified by transistors 30, 31, 32, 33, and 34 emerge at 57 with −2T, −T, 0, T, and 2T amounts of delay, respectively.

The weights of the amplifiers using transistors 30, 31, 32, 33, and 34 necessary for a particular filter function can be determined by equation 1 given above in the description of prior art.

The weighting factors of each tapped signal can be determined with a capacitive voltage divider rather than by the drain current of each amplifier. This is illustrated in FIG. 3, which in other respects is identical to the embodiment shown in FIG. 1. A capacitor 70 is connected between tap 24 and the gate of transistor 30. Another capacitor, 71, is connected between the gate of 30 and ground. The impedance of capacitors 70 and 71 form a voltage divider which divides the signal from tap 24. The ratio of the impedance of capacitor 70 to the sum of the impedances of capacitors 70 and 71 provides the required weighting factor.

Capacitor 72, connected between tap 25 and the gate of transistor 31, and capacitor 73, connected between this gate and ground, also form a voltage divider to weight the tapped signal. Other capacitors can be used in a similar manner to form voltage dividers to weight the signals from taps 26, 27, and 28 (not shown for simplicity).

Since in this embodiment the drain currents are not used for weighting, resistors 35, 36, 37, 38, and 39 and capacitors 40, 41, 42, 43, and 44 of FIG. 1 are not necessary and can be eliminated. The sources of all five transistors can thus be directly connected to ground as partially shown in FIG. 3.

Resistor 74, typically having a high value such as 100 Kohms, is connected between the gate of FET 30 and ground. Resistor 75, typically having a high value such as 100 Kohms, is connected between the gate of FET 31 and ground. Resistors 74 and 75 are bias resistors which establish the gate voltages of FET's 30 and 31, respectively. Other similar resistors are connected between the gates of each of transistors 32, 33, and 34 and ground.

The capacitive divider weights shown in FIG. 3 can be used when FET's 30, 31, 32, 33, and 34 are replaced with other types of amplifiers.

In high frequency circuits, the input and output impedances of the filter are quite crucial. A mismatch causes reflections, standing waves, phase shifts, and attenuation of the signal. These effects degrade the signal and limit the usable bandwidth of the circuit. In the circuits shown in FIGS. 1 and 3, the capacitance of the taps disturbs the impedance of transmission line 21. This tap capacitance consists either of the input capacitance of the FET (for the embodiment illustrated in FIG. 1), or the combined capacitance of the capacitive voltage divider and amplifier input (for the embodiment illustrated in FIG. 3). The adverse effects of the tap capacitance can be avoided. In fact, the tap capacitance can be used as part of an impedance matching circuit and also contribute to the delay by participating in the impedance of the transmission line.

The input impedance of transmission line 21 can be modeled as shown in FIG. 4, where 82 and 83 are equal pieces of the transmission line each having a characteristic impedance of ZO, L is the total length of the line, C is the capacitance of tap 84, and ZL is the desired input impedance of the circuit. The input 81 is connected to one end of impedance 82. The other end of impedance 82 is connected to one end of impedance 83 and through capacitor 84 to ground. The other end of impedance 83 is connected to ground through load impedance 85, having impedance ZL.

Figure 5:
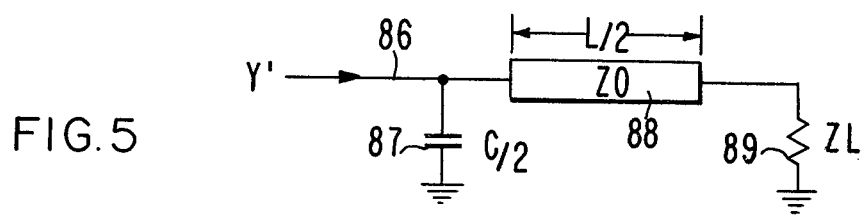
FIG. 5 is a half section model of a tapped transmission line.

This model can be simplified by considering a half section as shown in FIG. 5. ZO is the characteristic impedance of transmission line 88 having length L/2, 87 is half of the capacitance of the tap, and 89 is the load impedance ZL, the desired input impedance of the circuit. The input 86 is connected to one end of impedance 88 and is also shunted to ground by capacitance 87. The other end of impedance 88 is connected to ground through load impedance 89. The admittance of this model is:

$$Y' = \frac{j2\pi fc}{2} + YO \left[ \frac{YL \cos 2\pi \frac{L}{2\lambda_m} + jYO \sin 2\pi \frac{L}{2\lambda_m}}{YO \cos 2\pi \frac{L}{2\lambda_m} + jYL \sin 2\pi \frac{L}{2\lambda_m}} \right] \quad (2)$$

where YO and YL are the admittances of ZO and ZL, respectively, f is the frequency, and $\lambda_m$ is the wavelength. This formula can be simplified by assuming that L is much smaller than $\lambda_m$. By using the small angle approximations for the sine and cosine and assuming that the desired impedance is purely resistive (which implies the imaginary part of admittance Y' is zero), this equation simplifies to:

$$YO < \left[ \frac{-\lambda_m VC}{L} + \sqrt{\left(\frac{\lambda_m VC}{L}\right)^2 + 4(YL)^2} \right] /2 \quad (3)$$

where $\lambda_m$ is the wavelength in the transmission line, V is the speed of light, L is the length of the line, and C is the tap capacitance in farads. This equation expresses the necessary transmission line impedance 1/YO to achieve a desired input impedance 1/YL for a given tap capacitance C. By using a transmission line with the proper impedance 1/YO, the input of the filter will appear to have an impedance of 1/YL and thus provide a broadband impedance match.

It is also desirable to have a properly matched output circuit. For either the embodiment shown in FIG. 1 or that shown in FIG. 3, the tap capacitance is the output capacitance of the FET amplifier. By using equation 3, the necessary impedance of transmission line 50 can be calculated for a given tap capacitance and desired output impedance.

Figure 6:
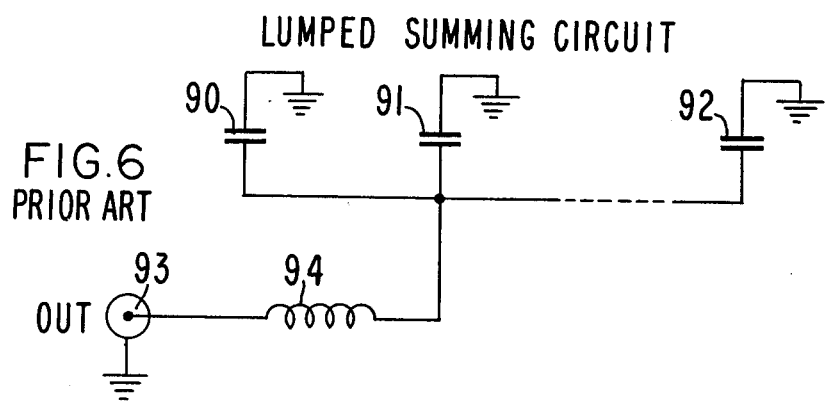
FIG. 6 is a schematic diagram showing a lumped summing circuit of the prior art.

In high frequency operation, it is not only important for the output of the transversal filter to be matched in impedance to the connecting circuits. The output must also have a large bandwidth. This is accomplished with the distributed summing circuit shown in FIGS. 1 and 3 in which taps 45, 46, 47, 48, and 49 place the weighted signal onto transmission line 50 in a distributed manner. In transversal filters designed for low frequencies, it is acceptable to gather all the weighted signals and sum them at a junction. This restricts the bandwidth of the output of the filter. This is shown in FIG. 6 where 90, 91, and 92 represent the output capacitances of the weighting amplifiers, and inductor 94 represents the inductance of the summing junction. Such a summing circuit has an approximate corner frequency of $W_0 = 1/\sqrt{LnC}$ where L is the inductance of 94, C is the output capacitance of each of the weighting amplifiers, and n is the number of weighting amplifiers. The bandwidth is $1/(\sqrt{n}\sqrt{LC})$.

Figure 7:
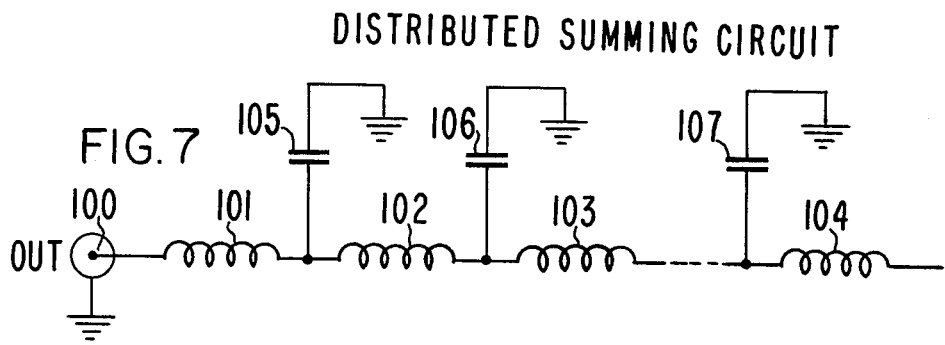
FIG. 7 is a schematic diagram of the summing circuit of the present invention showing the advantage of a distributed summing circuit.

A distributed summing circuit is shown in FIG. 7. Capacitors 105, 106, and 107 represent the output capacitances of the weighting amplifiers. Inductors 101, 102, 103, and 104 represent the (equal) piecewise inductances of the transmission line. The approximate resonate frequency of the circuit is $W_0 = 1/\sqrt{LC}$ where L is the inductance of each inductor and C is the capacitance of each amplifier. The bandwidth in this case is $1/\sqrt{LC}$. The bandwidth of the distributed summing network is thus greater than that of the lumped summing circuit by a factor of $\sqrt{n}$. In practice, the bandwidth of a transversal filter utilizing a distributed summer was found to be limited only by the characteristics of the amplifiers.

The distributed summing circuit has the additional advantage of contributing to the delay of the weighted signals if used in the proper manner. The input 20 and output 57 as shown in FIG. 1 are located on the same end of the filter. This forces the weighted signals to travel towards the right, along transmission line 21, and then return towards the left, along transmission line 50. Each weighted signal is delayed by the amount of time it spent on transmission lines 21 and 50. The signal weighted by transistor 34 is delayed 4TA seconds as it travels from 20 along transmission line 21 to tap 28, and 4TB seconds as it travels from 49 to 57 along transmission line 50. Because of this doubling back, this signal is delayed 4(TA+TB) seconds relative to the signal weighted by transistor 30.

If the output were taken from the right end of transmission line 50 rather than the left end, the signal weighted by transistor 34 would be delayed by 4TA seconds as it travels from 20 to 28 to 49 to 51, while the signal weighted by transistor 30 would be delayed by 4TB seconds as it traveled from 20 to 24 to 45 to 51. The relative delay would then be 4TA−4TB seconds rather than 4TA+4TB seconds in the case of the doubling back distributed summer. This additional delay, not possible with a lumped summing circuit, is of particular importance because it makes more effective use of space-consuming transmission line.

These concepts of distributed summing means and optimized geometry for additional delay are viable for transversal filters using any type of weighting means, not just FET's.

Figure 8:
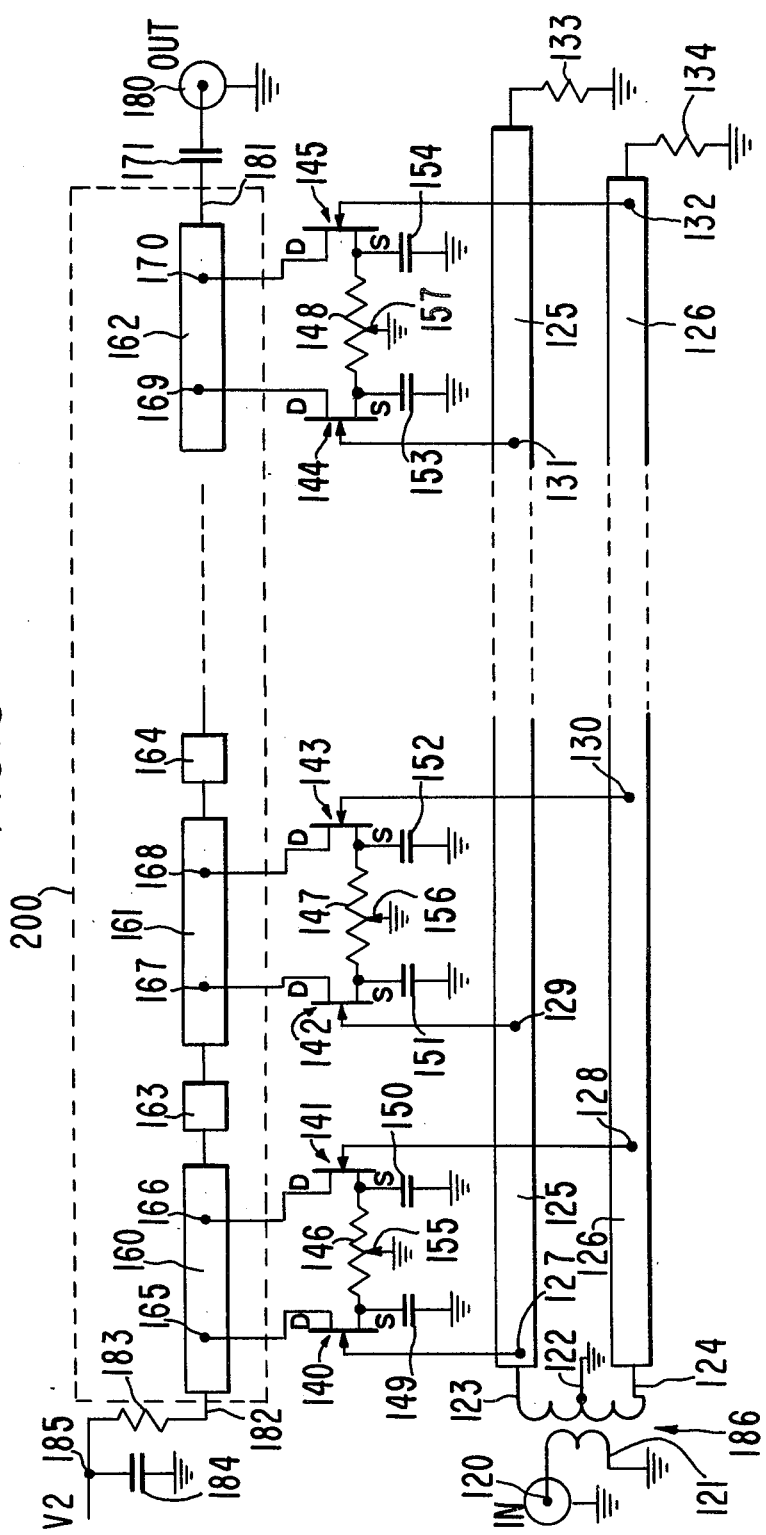
FIG. 8 is a schematic diagram showing an embodiment of the transversal filter of the invention with positive and negative weighting factors and additional amounts of delay.

An embodiment that provides both positive and negative weighting factors is shown in FIG. 8. The input signal is fed to input terminal 120, which is connected to primary coil 121 of pulse amplifier transformer 186. One end of secondary 123 of this transformer is connected to one end of line 125, which is terminated through resistor 133 to ground. The other end 124 of the secondary of transformer 186 is connected to one end of transmission line 126, the other end of which is terminated through resistor 134 to ground. The values of resistors 133 and 134 are equal to the desired impedances at points 123 and 124, respectively.

The secondary of impulse transformer 186 is center tapped at 122 and connected to ground. The version of the signal applied to transmission line 125 will be of opposite polarity with respect to ground than that applied to line 126 because of the grounding center tapping of transformer 186.

The signal propagating along line 125 is tapped at 127, 129, and 131. The resulting tapped signals are amplified in a weighted manner by FET transistors 140, 142, and 144, respectively. The signal propagating along line 126 is tapped at 128, 130, and 132. The resulting tapped signals are amplified in a weighted manner by FET transistors 141, 143, and 145, respectively. In each case, the weighting factors are determined by the drain currents of these transistors.

A potentiometer 146 is connected between the sources of transistors 140 and 141. The wiper 155 of potentiometer 146 is connected to ground. The position of this wiper determines the relative drain currents of transistors 140 and 141. This affects the gain and thus the weighting factors of transistors 140 and 141.

The sources of transistors 140 and 141 are each connected to ground through bypass capacitors 149 and 150, respectively. The drains of transistors 140 and 141 are connected to taps 165 and 166, respectively, of transmission line 160. Taps 127, 128, 165, and 166 are placed such that the delay between taps 127 and 128 is equal to the delay between taps 165 and 166, so that the signal which passes from 120 to 123 to 127 to 165 to 166 arrives at 166 at the same time as the signal from 120 to 124 to 128 to 166. Since the signals amplified by transistors 140 and 141 are of opposite polarity, the difference of the two weighted signals is formed at 166. By adjusting wiper 155 of variable resistor 146, a net positive or negative weighting can be achieved. Transistors 140 and 141 thus combine to form a bipolar weighting amplifier.

Variable resistors 147 and 148 are connected between the sources of transistors 142 and 143, and 144 and 145, respectively. The relative drain currents and thus the gain between transistors 142 and 143, and between transistors 144 and 145, are determined by the position of wipers 156 and 157 (each grounded) of resistors 147 and 148, respectively. Bypass capacitors 151, 152, 153, and 154 are connected between the sources of transistors 142, 143, 144, and 145, respectively, and ground. The drains of these four transistors are connected to taps 167, 168, 169, and 170, respectively, of transmission lines 161 (for taps 167 and 168) and 162 (for taps 169 and 170). Taps 165, 166, 167, 168, 169, and 170 are connected to their respective transmission lines at other than end points thereof, as is illustrated in the model of a capacitively coupled transmission line, FIG. 4.

The delay between taps 129 and 130 is equal to that between taps 167 and 168. The delay between taps 131 and 132 is equal to that between taps 169 and 170. Since the signals on lines 125 and 126 are of opposite polarity, a net positive or negative weighted signal amplified by transistors 142 and 143 is formed at 168. Similarly, a net positive or negative weighted signal amplified by transistors 144 and 145 is formed at 170.

Only three such bipolar weighted amplifiers are shown in FIG. 8 for simplicity, but the circuit can be effectuated with an arbitrary integral number X of such amplifiers, where X is greater than or equal to two.

Transmission lines 160 (containing taps 165 and 166), and 161 (containing taps 167 and 168) are connected by a delay means 163, which can be an additional length of transmission or coaxial line. 164 is a similar delay means connecting transmission lines 161 and 162. Lines 160, 161, and 162 and delay means 163 and 164 together from distributed summer 200. The signal amplified by the bipolar weighting amplifier comprised of transistors 140 and 141 is delayed by the delay introduced by that portion of line 126 between 124 and 128, plus the delay introduced by that portion of summer 200 between 166 and 181. The signal amplified by the bipolar weighting amplifier comprised of transistors 142 and 143 is delayed by the delay introduced by that portion of line 126 falling between 124 and 130, plus the delay introduced by that portion of summer 200 between 168 and 181. The net difference in delay introduced by these two bipolar weighting amplifiers is the delay introduced by that portion of summer 200 between 166 and 168, minus the delay introduced by that portion of line 126 falling between 128 and 130. This provides the amount of delay needed for the particular application.

The delayed and the weighted signals emerge at end 181 of summer 200, which is connected through capacitor 171 to output terminal 180, which can be the center of a grounded coaxial connector as illustrated in FIG. 8. The other end 182 of summer 200 is connected to a point 185 via terminating resistor 183, having an impedance equal to the desired impedance seen at output 180. Point 185 is connected to a voltage supply V2 and is shunted to ground through bypass capacitor 184. Voltage supply V2 charges the distributed summing circuit, which in turn supplies power to transistors 140, 141, 142, 143, 144 and 145.

As shown, the circuit in FIG. 8 utilizes a feedthrough delay scheme. The circuit can be modified to utilize a doubling back delay as shown in FIG. 1 by interchanging ends 182 and 181 of the distributed summing circuit 200. In this arrangement, the end of resistor 183 normally connected to 182 is instead connected to 181, while the end of capacitor 171 normally connected to 181 is instead connected to 182. An additional amount of delay equal to twice the delay introduced by line 160 must be inserted between 123 and 127. The delay T between any two adjacent bipolar weighting amplifiers (assuming they are equally spaced along the delay line), will then be equal to the delay introduced by delay means 163, plus the delay introduced by line 161, plus the delay introduced by that portion of line 126 falling between points 128 and 130.

At high frequencies, the transmission lines used in these embodiments are typically microstrip lines. The width of the microstrip needed to achieve the desired input or output impedance for a given tap capacitance can be determined as follows. First, estimate the W/H ratio of the microstrip, where H is the thickness of the dielectric, and W is the width of the microstrip. Find the wavelength in the microstrip, $\lambda m$, associated with the estimated W/H using a graph which relates the ratio of the wavelength in free space to that in a microstrip. The construction of such a graph is described in an article by H. A. Wheeler, "Transmission-Line Properties of Parallel Strips Separated by a Dielectric Sheet", IEEE *Transactions on Microwave Theory and Techniques,* Vol MTT-13, March, 1965, pages 172–185. Then calculate the necessary transmission line admittance, YO, from equation (3) above using this $\lambda m$, along with the speed of light, $V = 3 \times 10^{10}$ centimeters per second, the tap capacitance C, and the length of the line L in centimeters. Next find the necessary W/H to achieve the impedance 1/YO. This can be done using a graph which relates the characteristic impedance of a transmission line to the W/H of a microstrip. The construction of such a graph is also described in the above article by Wheeler. Then check to see if the $\lambda m$ based on the calculated W/H is much different from the initially assumed λm. If it is much different, then repeat this procedure using the calculated W/H to estimate the initial λm.

As an example, for the input delay line (which can be line 21, 125, or 126) suppose λm is 1.4; the length is 3.81 centimeters; the input capacitance of each FET is 3.2 pf; and the desired input impedance is 50 ohms. The calculated ZO using equation (3) is 110.76 ohms. To achieve a characteristic impedance of 110.76 ohms with a microstrip having a relative dielectric constant of 2.5, a W/H of 0.50 is needed. λm for a W/H of 0.5 is approximately 1.4 as initially estimated. If the thickness of the dielectric is 0.125 inches than the width W of the microstrip would have to be 0.063 inches to achieve a W/H ratio of 0.5.

As another example, for the distributed summer transmission line (which can be 50 or 200), suppose that λm is equal to 1.4, the length L is 1.905 centimeters, the output capacitance of each FET is 1.11 pf, and the desired output impedance is 50 ohms. The necessary transmission line impedance as calculated with equation (3) is 89.21 ohms. To achieve this impedance with a microstrip having a relative dielectric constant of 2.5, a W/H of 0.95 is necessary. If the thickness H of the dielectric is 0.125 inches, then the width W of the microstrip must be 0.119 inches.

A matched filter for rectangular pulses is particularly simple to implement since each tap weight is unity. To use the circuit shown in FIG. 1 as a five tap transversal filter for rectangular pulses of unity height and TT width, the delay T (equal to TA+TB) is set at TT/5. For a data pulse having width TT=2.5 nanoseconds, T must be 0.5 nanoseconds. The weighting factors of the amplifiers utilizing transistors 30, 31, 32, 33, and 34 all are one. One way to accomplish this is to connect the sources of all five transistors directly to ground, eliminating resistors 35, 36, 37, 38, and 39 along with capacitors 40, 41, 42, 43, and 44.

FET's designated as 2N5485 or similar FET's can be used in all embodiments. These transistors have an input capacitance of approximately 3.2 picofarads and an output capacitance of 1.1 picofarads. A desired filter input and output impedance of 50 ohms is usually assumed. Terminating resistors 23 and 52 should thus be 50 ohms. Coupling capacitors 56 and 53 are typically 1.0 microfarads. A supply voltage V1 of +15 volts d.c. is typical. The width of the microstrips for the input delay and distributed summer are as previously calculated.

This simple filter surpasses the performance of a two pole Butterworth filter. No significant amounts of input or output mismatch are noticeable. The circuit can be used from d.c. to frequencies limited only by the FET characteristics. Using GaAs FET's of present technology, the frequency range of the circuit shown in FIGS. 1, 3 and 8 is 0 hertz to 5 GHz.

The above description is included to illustrate the operation of the preferred embodiments and does not limit the scope of the invention. The scope of the invention is to be limited only by the following claims. From the above discussion, many variations will be apparent to one skilled in the art that would yet be encompassed by the spirit and scope of the invention. For example, the taps of the weighting amplifiers can be unequally spaced along the input and/or output delay lines for a certain desired output response.

What is claimed is:

1. A transversal filter having an input and an output comprising:
    a delay line connected to said input;
    a summer connected to said output; and
    at least two field effect transistors each having an input connected to said delay line at a different point thereon and each having an output connected to said summer at a different point thereon;
    wherein the gain of each transistor is variable by changing said transistor's source current by means of adjusting a variable resistor that is connected between said source and ground.

2. A matched filter for shaping rectangular output pulses comprising:
    an impedance-matched delay line;
    an impedance-matched summer; and
    at least two field effect transistors each having a gate connected to the delay line at a different point thereon, a source connected to ground via a variable resistance, and a drain connected to the summer at a different point thereon;
    wherein the gain of each transistor is adjusted by means of varying said resistance.

3. A transversal filter comprising;
    a first impedance-matched delay line;
    a second impedance-matched delay line;
    an impedance-matched summer;
    a first plurality of weighting amplifiers each having an input connected to the first delay line at a different point thereon and an output connected to the summer at a different point thereon; and
    a second plurality of weighting amplifiers each having an input connected to the second delay line at a different point thereon and an output connected to the summer at a different point thereon;
    wherein the signal propagating along the first delay line is of the opposite polarity as that propagating along the second delay line.

4. A transversal filter comprising:
    a delay line having an input and a terminated end;
    a summer having an output and a terminated end;
    a first transistor having a gate connected to said delay line and a drain connected to said summer;
    at least one additional transistor, each having a gate connected to said delay line and a drain connected to said summer;
    wherein all the gates are connected to said line at different points thereon and all the drains are connected to said summer at different points thereon;
    wherein the gate of the first transistor is connected closer to the input of said delay line than the input of any other transistor and the output of the first transistor is connected closer to the output of said summer than the output of any other transistor;
    wherein each of said transistors has a source connected to ground via a variable resistance, said resistance being adjustable so as to set the gain of said transistor and thereby affect the frequency response of said filter.

5. A transversal filter for shaping the characteristics of an electromagnetic signal having an input and an output comprising:
    a first transmission section connected to said input;
    a second transmission section connected to said output;
    at least two weighting transistors, each having a gate connected to said first section and a drain connected to said second section;

wherein the impedance of each section is related to the length of said section by the expression:

$$\frac{2}{Z_o} = \frac{-\lambda_m VC}{L} + \sqrt{\left(\frac{\lambda_m VC}{L}\right)^2 + \left(\frac{2}{Z_L}\right)^2}$$

where $Z_o$ is the impedance of the section;
L is the length of the section;
λm is the wavelength of the signal in the section divided by the wavelength of the signal in freespace, with λm being much greater than L;
C is the capacitance of each transistor;
V is the velocity of light; and
$Z_L$ is the desired characteristic impedance of the filter.

* * * * *

UNITED STATES PATENT AND TRADEMARK OFFICE
CERTIFICATE OF CORRECTION

PATENT NO. : 4,291,286
DATED : September 22, 1981
INVENTOR(S) : Gary L. Wagner

It is certified that error appears in the above-identified patent and that said Letters Patent are hereby corrected as shown below:

In column 10, claim 2, line 1 delete "output" and insert in place thereof --input--.

Signed and Sealed this

First Day of December 1981

[SEAL]

Attest:

Attesting Officer

GERALD J. MOSSINGHOFF

Commissioner of Patents and Trademarks